United States Patent [19]

Sato

[11] 4,054,840
[45] Oct. 18, 1977

[54] FM DEMODULATOR USING MULTIPLIER TO WHICH DELAYED AND UNDELAYED INPUT SIGNALS ARE APPLIED

[75] Inventor: Teruo Sato, Yamato, Japan

[73] Assignee: Sony Corporation, Tokyo, Japan

[21] Appl. No.: 721,525

[22] Filed: Sept. 8, 1976

[30] Foreign Application Priority Data

Sept. 10, 1975 Japan .............................. 50-109865

[51] Int. Cl.² ............................................. H03D 3/14
[52] U.S. Cl. ................................. 329/103; 325/349; 329/137; 329/145
[58] Field of Search .............. 329/103, 110, 137, 145; 325/349

[56] References Cited

U.S. PATENT DOCUMENTS 3,387,220  6/1968  Lender ............................ 329/145 X
3,701,030  10/1972  Gocho et al. ................... 329/137 X

OTHER PUBLICATIONS

Grimbleby et al. "A new high-performance phase-sensitive detector," Journal of Physics E, vol. 4, No. 12, Dec. 1971, pp. 941-944.

Primary Examiner—Siegfried H. Grimm
Attorney, Agent, or Firm—Lewis H. Eslinger; Alvin Sinderbrand

[57] ABSTRACT

An FM signal demodulator including a multiplier having a pair of input terminals and an output terminal. A signal coupling circuit is connected between a circuit input terminal and one of the input terminals of the multiplier to couple an FM signal to the multiplier, and a delay line and a phase shifter are connected in cascade between the signal input terminal and the other input terminal of the multiplier. A low pass filter is connected to the output terminal of the multiplier to allow the demodulated signal to reach the circuit output terminal.

7 Claims, 4 Drawing Figures

FM DEMODULATOR USING MULTIPLIER TO WHICH DELAYED AND UNDELAYED INPUT SIGNALS ARE APPLIED

BACKGROUND OF THE INVENTION

1. Field of the Invention

The present invention relates generally to an FM demodulator and more particularly to an FM demodulator using a multiplier.

2. Description of the Prior Art

In the past, ratio detectors have been generally used as FM demodulators. Recently, so-called quadrature FM detectors, which employ a multiplier, have come to be used as FM detectors because the quadrature FM detector has a wide linear operation range and is easily produced as an integrated circuit. In quadrature FM detectors, one of the FM signals is applied directly to the multiplier and the other FM signal is applied to the multiplier through a delay circuit. The amount of phase-shift produced by the delay circuit is changed in response to the frequency of the signal applied thereto. The multiplier output signal, which is the product of both of the signals, is then passed through a low pass filter and emerges as the demodulated signal.

With this kind of FM demodulator, however, it is well known that its detected output signal amplitude is proportional to the amount of delay produced by its delay circuit, and the center frequency of the demodulator is also a function of the amount of delay of the delay circuit.

Accordingly, the amount of delay in a prior art quadrature FM detector is set so as to make the detected output level optimum, and if the center frequency is then adjusted so as to make the distortion ratio of the demodulator minimum, the detected output level will have deviated from the optpimum value. Thus, the output level of the demodulated signal and the center frequency of a prior art FM demodulator using a multiplier cannot be adjusted independently.

OBJECTS AND SUMMARY OF THE INVENTION

It is an object of the present invention to provide an improved FM demodulator free from the above-described defect of the prior art.

It is another object of the invention to provide an FM demodulator which includes only the addition of a phase shifter to permit its detected output level and center frequency to be adjusted independently.

In accordance with the present invention, an FM demodulator circuit that includes a multiplier has a circuit input terminal to which a frequency modulated signal is supplied. The circuit input terminal is connected to (or comprises) one of the input terminals of the multiplier. A low pass filter is connected to the output terminal of the mulitplier to filter out undesired high frequency RF or IF components so as to leave only the demodulated signal. A circuit that includes a series connection of a delay line and a phase shifter connects the signal input terminal of the circuit to the other input terminal of the multiplier.

Further objects, features, and advantages of the present invention will be apparent from the following description taken in conjunction with the drawings.

DESCRIPTION OF THE PREFERRED EMBODIMENTS

An example of the FM demodulator according to the present invention will be now described with reference to FIGS. 1, 2A, and 2B.

Figure 1:
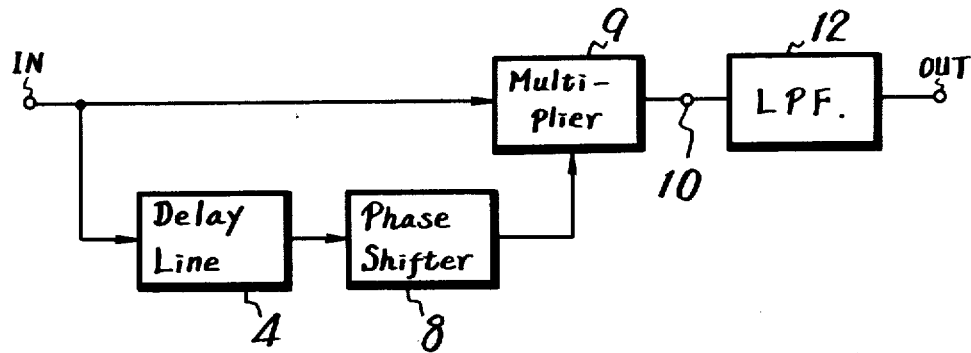
FIG. 1 is a block diagram showing an embodiment of an FM demodulator according to the present invention.

The circuit in FIG. 1 includes a circuit input terminal IN to which an FM signal is applied. This FM signal is applied to a delay line 4, the amount of delay of which is varied in response to the frequency of the FM signal. In the example of FIG. 1, a phase shifter 8 is connected to the output side of the delay line 4. The phase shifter 8 will be described later, and only the effect of the delay line 4 will be considered at this point. A multiplier 9 receives the FM signal directly from the input terminal IN and also receives the output signal of the delay line 4. The output signal of the multiplier 9 is taken from its output terminal 10 and fed through a low pass filter 12 to an output terminal OUT at which the demodulated output siganl of the FM signal is obtained.

The FM signal $e_1(t)$ applied to the input terminal IN can be expressed by the following equation (1)

$$e_1(t) = \sin(2\pi ft) \quad (1)$$

where $f$ is the instantaneous frequency and $t$ is the time. The output signal $e_2(t)$ from the delay line 4 is expressed as follows:

$$e_2(t) = \sin[2\pi ft + \phi(2\pi f)] \quad (2)$$

Thus, if the phase shifter 8 is omitted the multiplied output signal $e_3(2\pi f)$, after carrier frequency components have been filtered out, can be obtained at the output terminal OUT and expressed as follows:

$$e_3(2\pi f) = G \cdot e_1(t) \cdot e_2(t) = G/2 \cos[\phi(2\pi f)] \quad (3)$$

where G is the detection gain.

If the phase shifting amount $\phi(2\pi f)$ is expressed as follows:

$$\phi(2\pi f) = 2\pi Af \quad (4)$$

where A is a proportional constant delaying amount, the signal $e_3(2\pi f)$ is expressed as follows:

$$e_3(2\pi f) = G/2 \cos(2\pi Af) \quad (5)$$

Figure 2A:
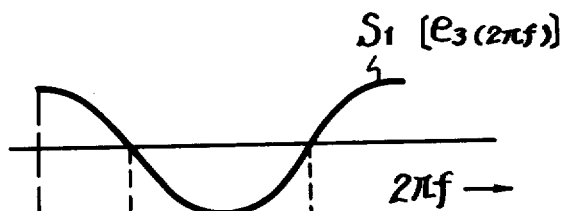
FIGS. 2A and 2B are graphs used for explaining the embodiment of the invention shown in FIG. 1.

This signal $e_3(2\pi f)$ is shown in FIG. 2A by a cosine curve $S_1$.

Further, the differentiated gain of the signal $e_3(2\pi f)$ is expressed as follows:

$$\frac{de_3(2\pi f)}{d(2\pi f)} = -\frac{G}{2} \cdot A \cdot \sin(2\pi Af) \quad (6)$$

Figure 2B:
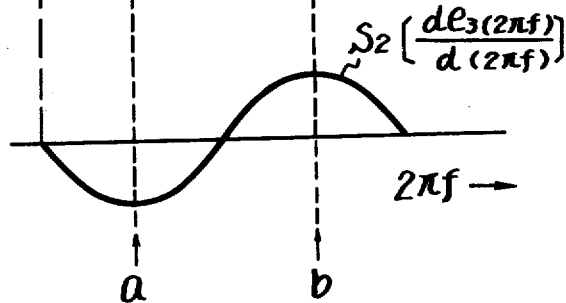

This differentiated gain is shown in FIG. 2B by a curve $S_2$.

If the carrier frequency $f_0$ is selected to be on the most nearly linear portion of the differentiated gain characteristic curve, which is within a few degrees of those points at which the cosine curve $S_1$ crosses the zero axis, the carrier frequency must be selected to make the factor sin $(2\pi A f_0)$ a maximum or minimum at such points, which are identified as points $a$, $b$, etc. The factor sin$(2\pi A f)$ is a maximum when sin$(2\pi A f) = \sin \pi/2$. If that is to be true, $2\pi A f$ must be equal to $\pi/2$, which requires that $f = 1/4A$. Thus, if the carrier frequency $f_0$ is expressed as a general formula, the following equation (7) is obtained:

$$f_0 = 1/A \cdot (2n - 1)/4 \tag{7}$$

where $n$ is 1, 2, 3, etc., corresponding to any of the points at which the cosine curve $S_1$ crosses the zero axis.

As may be apparent from equation (5) above, the level of the output signal is in proportion to the proportional constant delaying amount A. Thus, if it is desired that the carrier frequency $f_0$ be selected to have an optimum value as described above, and the level of the demodulated output signal is also selected at a desired value, the values $f_0$ and A can not be selected independently of each other which is inconvenient.

In order to overcome the above problem, the phase shifter 8 is provided in the example of the present invention shown in FIG. 1 and is shown to be connected to the output side of the delay line 4 and in series therewith. Alternatively, the phase shifter 8 could be connected at the input side of the delay line 4.

If the FM modulated signal $e_1(t)$ is as expressed by the equation (1), the output signal $e_2(t)$ of the phase shifter 8 can be expressed by the following equation (8):

$$e_2(t) = \sin[2\pi ft + \phi_1(2\pi f) + \phi_2] \tag{8}$$

in which the term $\phi_1(2\pi f)$ represents the phase of a function of the instantaneous frequency $f$ of the FM medulated signal based upon the operation of the delay line 4 and $\phi_2$ is a constant phase independent of the frequency $f$ and based upon the effect produced by the phase shifter 8. Thus, the multiplied output signal $e_3(2\pi f)$ obtained at the output terminal OUT becomes as follows:

$$e_3(2\pi f) = G \cdot e_1(t) \cdot e_2(t) = G/2 \cos[\phi_1(2\pi f) + \phi_2] \tag{9}$$

If the term $\phi_1(2\pi f)$ is expressed as
$\phi_1(2\pi f) = 2\pi A f$ the signal $e_3(2\pi f)$ becomes as follows:

$$e_3(2\pi f) = G/2 \cos (2\pi A f = \phi_2)$$

Thus, its differentiated gain $[de_3(2\pi f)]/d(2\pi f)]$ is expressed as follows:

$$\frac{de_3(2\pi f)}{d(2\pi f)} = -\frac{G}{2} \cdot A \cdot \sin(2\pi A f + \phi_2) \tag{10}$$

In order to select the carrier frequency $f_0$ on the most linear portions of the differentiated gain characteristic curve, the carrier frequency $f_0$ must be selected to make the value of sin$(2\pi A f + \phi_2)$ maximum or minimum. Thus, in a manner corresponding to the previous analysis, the carrier frequency $f_0$ can be expressed as follows:

$$f_0 = \frac{1}{A} \cdot \frac{2n-1}{4} - \frac{\phi_2}{2A}$$

where $n = 1, 2, 3, \ldots$.

Since the level of the demodulated output signal is in proportion to the proportional constant delay A, even if the constant A is selected to make the demodulated output level optimum, the carrier frequency $f_0$ can still be selected to have an optimum value independently of the demodulated output level as may be apparent by varying $\phi_2$ in the last equation.

For example, if the intermediate frequency of an FM radio receiver is 10.7 MHz, if the delay line 4 is selected to produce a delay of 140 n sec, the shifting amount $\phi_2$ of the phase shifter 8 is selected to be 90°.

Figure 3:
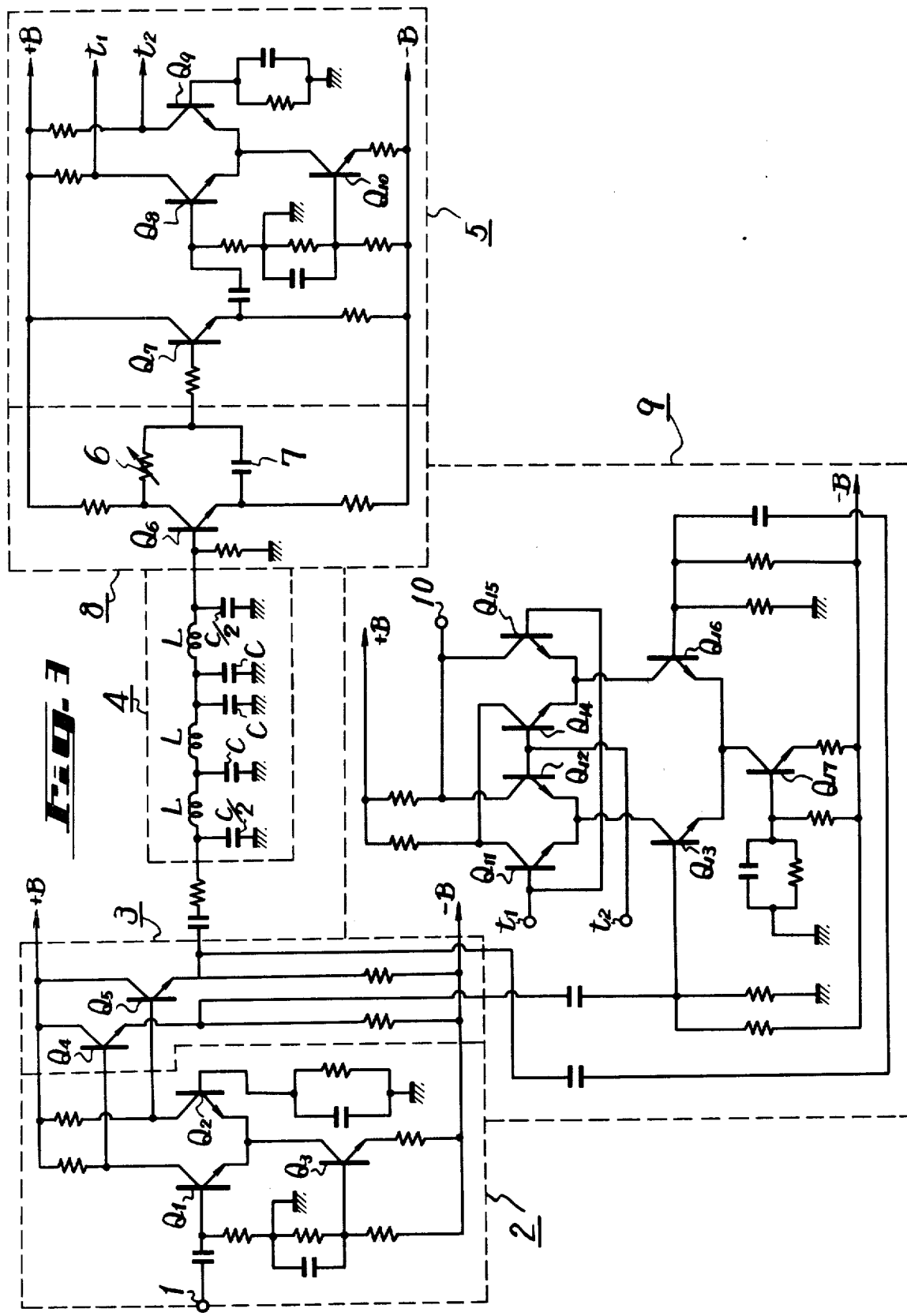
FIG. 3 is a circuit diagram showing another embodiment of the invention.

Another embodiment of the present invention will be hereinbelow described with reference to FIG. 3. In FIG. 3, an input terminal 1 is supplied with an FM signal. This input terminal 1 is connected to the input side of an amplifier circuit 2, which is a differential amplifier circuit having transistors $Q_1$ and $Q_2$ as amplifying elements. A third transistor $Q_3$ serves as a constant current source. The input terminal 1 is connected to the base electrode of the transistor $Q_1$. The next stage of the amplifier circuit 2 is a buffer amplifier circuit 3, which consists of transistors $Q_4$ and $Q_5$ connected as emitter followers. The base electrodes of the latter transistors are connected to the collector electrodes of the transistors $Q_1$ and $Q_2$, respectively. A delay circuit, or line, 4 is connected to the emitter of the transistor $Q_5$ at the output side of the buffer amplifier circuit 3. The amount of delay is a function of the frequency change of the FM signal. This delay line could be, for example, an L-C type low pass filter, as shown. The capacities and inductances of respective capacitors and coils in the delay line 4 are selected as C/2, C, ... C, C/2 and L, L, ... L, L, respectively.

The output of the delay line 4 is connected to a phase shifter 8 which shifts the phase of the applied signal by a substantially constant amount for the frequency variation of the FM signal. The phase shifter 8 is an all pass filter in this example and includes a transistor $Q_6$, having its base electrode connected to the output side of the delay line 4 to receive the delayed signal therefrom. A resistor 6 and a capacitor 7 are connected in series between the collector and emitter electrodes of the transistor $Q_6$, and the connection point between the resistor 6 and capacitor 7 is the output terminal of the phase shifter 8. The amount of phase shift can be varied by changing, for example, the resistance of the resistor 6. In the example shown in FIG. 3, the phase shifter 8 is connected to the output side of the delay line 4, but it is possible for the delay 4 to be connected, instead, to the output side of the phase shifter 8 with the same effect.

Following the phase shifter 8 is a buffer amplifier circuit 5. This circuit includes an input stage that operates as an impedance converting circuit and is formed of a transistor $Q_7$ connected as an emitter follower. The amplifier 5 also includes a differential amplifier circuit consisting of amplifying transistors $Q_8$ and $Q_9$ and a constant current transistor $Q_{10}$. In this case, the base electrode of the transistor $Q_7$ is connected to the connection point between the resistor 6 and the capacitor 7 and its emitter is connected to the base of the transistor $Q_8$. The collector electrodes of the transistors $Q_8$ and $Q_9$ are connected to input terminals $t_1$ and $t_2$ of a multiplier 9.

The FM signal from the buffer amplifier 3 as well as the delayed FM signal from the buffer amplifier circuit 5 are applied to the multiplier 9 which multiplies one of these signals by the other to produce a demodulated signal.

The multiplier 9 is shown to include transistors $Q_{11}$ to $Q_{17}$. The transistors $Q_{11}$ to $Q_{13}$ and $Q_{17}$ form a differential amplifier circuit at the input side, and the transistors $Q_{14}$ to $Q_{17}$ form a differential amplifier at the output side, respectively. The transistors $Q_{11}$ and $Q_{12}$, and the transistors $Q_{14}$ in this embodiment serve as amplifying transistors, the transistors $Q_{13}$ and $Q_{16}$ serve as variable current transistors, and the transistor $Q_{17}$ serves as a constant current transistor, respectively.

The FM signals of opposite polarity are differentially fed from the amplifier 2 through the buffer amplifier circuit 3 to the base electrodes of the transistors $Q_{13}$ and $Q_{16}$ of the multiplier 9, respectively, and the delayed FM signals of opposite polarity are respectively fed from the buffer amplifier 5 to the base electrodes of the transistors $Q_{11}$ and $Q_{15}$ through the input terminal $t_1$, and to the base electrodes of transistors $Q_{12}$ and $Q_{14}$ through the input terminal $t_2$. An output terminal 10 is connected to the collector electodes of the transistors $Q_{12}$ and $Q_{15}$, and the demodulated signal is obtained therefrom. This demodulated signal may then be passed through a smoothing filter like the filter 12 in FIG. 1.

In FIG. 3, the power supply has a positive terminal $+B$ and a negative terminal $-B$.

The theory of operation of the circuit shown in FIG. 3 is substantially the same as that of the circuit shown in FIG. 1, so that its description will be omitted.

It will be apparent from the foregoing, that the FM demodulator of the present invention includes a delay device or line that delays the signal applied to it by an amount that varies in response to the frequency variation of the FM signal. The demodulator also includes a phase shifter whose phase-shifting amount is substantially constant for the frequency variation of the FM signal. It further includes a multiplier in which the FM signals and the delayed FM signals obtained by supplying the FM signals to the series circuit of the delay device and the phase shifter are multiplied together to produce the demodulated signal. As a result, the optimum angular frequency at which the differentiating gain is substantially flat and the demodulated output level can be selected freely and independently of each other.

Further, with the FM demodulator of the invention the scattering of the total phase-shifting amount or delaying amount of the series circuit of the delay device and the phase shifter can be corrected, and the delay characteristics can be improved.

It is not necessary that the delay device 4, phase shifter 8 and multiplier 9 be limited to the embodiments described above and shown in the drawings; other suitable embodiments could be used, instead.

It will be apparent that modifications and variations could be effected by one skilled in the art without departing from the spirit or scope of the novel concepts of the present invention, so that the true scope of the invention should be determined only by the following claims.

What is claimed is:

1. An FM demodulator comprising:
   a. a signal input terminal supplied with a frequency modulated signal;
   b. a multiplier having a pair of input terminals and an output terminal;
   c. a low pass filter connected to the output terminal of said multiplier to filter the output signal of the multiplier;
   d. coupling means for coupling said signal input terminal to one of said input terminals of said multiplier; and
   e. a series circuit comprising a delay line and a phase shifter connected between said signal input terminal and the other of the input terminals of said multiplier.

2. An FM demodulator according to claim 1, in which said delay line comprises an L-C type low pass filter.

3. An FM demodulator according to claim 1, in which said phase shifter comprises an all pass filter circuit.

4. An FM demodulator according to claim 3, in which said all pass filter comprises:
   a. a transistor having base, emitter and collector electrodes, the base being connected to the output of said delay line;
   b. a collector load resistor and an emitter load resistor connected to the collecter and emitter, respectively; and
   c. a second series circuit comprising a variable resistor and a capacitor connected between the collector and emitter electrodes of said transistor, the connection point between the variable resistor and capacitor comprising an output terminal of said all pass filter.

5. An FM demodulator according to claim 1, in which said multiplier comprises at least three cascade-connected differential amplifiers.

6. An FM demodulator according to claim 1, further including a buffer amplifier connected between said signal input terminal and the input side of said first-named series circuit comprising the delay line and the phase shifter.

7. An FM demodulator according to claim 6, further including a further buffer amplifier connected between the output side of said first-named series circuit and the other of said input terminals of said multiplier.

* * * * *